(12) United States Patent
Rueger (10) Patent No.: US 8,828,883 B2
(45) Date of Patent: Sep. 9, 2014

(54) METHODS AND APPARATUSES FOR ENERGETIC NEUTRAL FLUX GENERATION FOR PROCESSING A SUBSTRATE

(75) Inventor: Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 725 days.

(21) Appl. No.: 12/862,359

(22) Filed: Aug. 24, 2010

(65) Prior Publication Data

US 2012/0048831 A1   Mar. 1, 2012

(51) Int. Cl.
H01L 21/302 (2006.01)
H01L 21/3065 (2006.01)
H01J 37/32 (2006.01)

(52) U.S. Cl.
CPC ....... *H01L 21/3065* (2013.01); *H01J 37/32009* (2013.01)
USPC ................. 438/714; 438/729; 216/67; 216/71

(58) Field of Classification Search
CPC ............ H01L 21/0234; H01L 21/3065; H01L 21/32136; H01L 21/76862
USPC ........................ 216/67, 71; 438/714, 729, 719
See application file for complete search history.

(56) References Cited

U.S. PATENT DOCUMENTS

| | | | |
|---|---|---|---|
| 5,983,828 A | 11/1999 | Savas | |
| 6,547,977 B1 | 4/2003 | Yan et al. | |
| 6,926,799 B2 | 8/2005 | Yeom et al. | |
| 7,033,514 B2 | 4/2006 | Rueger | |
| 7,060,931 B2 | 6/2006 | Yeom et al. | |
| 7,144,520 B2 | 12/2006 | Ichiki et al. | |
| 7,335,602 B2 | 2/2008 | Rauf et al. | |
| 7,385,183 B2 | 6/2008 | Park et al. | |
| 7,431,796 B2 | 10/2008 | Martin et al. | |
| 7,517,558 B2 | 4/2009 | Subramanian et al. | |
| 7,557,047 B2 | 7/2009 | Rueger et al. | |
| 7,649,316 B2 | 1/2010 | Rueger et al. | |
| 7,713,430 B2 | 5/2010 | Wilson | |
| 7,732,759 B2 | 6/2010 | Chen et al. | |
| 7,740,737 B2 | 6/2010 | Koshiishi et al. | |
| 2002/0160125 A1* | 10/2002 | Johnson et al. | 427/569 |
| 2002/0185226 A1* | 12/2002 | Lea et al. | 156/345.35 |
| 2003/0040178 A1 | 2/2003 | Rueger | |

(Continued)

OTHER PUBLICATIONS

Steinbruchel, Universal Energy Dependence of Physical and Ion-Enhanced Chemical Etch Yields at Low Ion Energy, Appl. Phys. Lett. vol. 55, No. 18, Nov. 6, 1989, pp. 1960-1962.

*Primary Examiner* — Binh X Tran
(74) *Attorney, Agent, or Firm* — Traskbritt (57) ABSTRACT

Apparatuses and methods for processing substrates are disclosed. A processing apparatus includes a chamber for generating a plasma therein, an electrode associated with the chamber, and a signal generator coupled to the electrode. The signal generator applies a DC pulse to the electrode with sufficient amplitude and sufficient duty cycle of an on-time and an off-time to cause events within the chamber. A plasma is generated from a gas in the chamber responsive to the amplitude of the DC pulse. Energetic ions are generated by accelerating ions of the plasma toward a substrate in the chamber in response to the amplitude of the DC pulse during the on-time. Some of the energetic ions are neutralized to energetic neutrals in response to the DC pulse during the off-time. Some of the energetic neutrals impact the substrate with sufficient energy to cause a chemical reaction on the substrate.

12 Claims, 6 Drawing Sheets

(56) References Cited

U.S. PATENT DOCUMENTS

| | | |
|---|---|---|
| 2004/0016876 A1 | 1/2004 | Yeom et al. |
| 2004/0171270 A1 | 9/2004 | Rueger |
| 2006/0275549 A1 | 12/2006 | Subramanian et al. |
| 2007/0221833 A1 | 9/2007 | Yeom et al. |
| 2007/0287300 A1 | 12/2007 | Rueger et al. |
| 2008/0134757 A1 | 6/2008 | Chen et al. |
| 2008/0156771 A1 | 7/2008 | Jeon et al. |
| 2009/0015160 A1 | 1/2009 | Rueger et al. |
| 2009/0095714 A1 | 4/2009 | Chen et al. |
| 2009/0194508 A1* | 8/2009 | Ui et al. .......................... 216/67 |
| 2009/0236314 A1 | 9/2009 | Chen |
| 2009/0239389 A1 | 9/2009 | Rueger et al. |
| 2009/0308312 A1 | 12/2009 | Subramanian et al. |
| 2010/0102031 A1 | 4/2010 | Rueger et al. |
| 2010/0190350 A1* | 7/2010 | Yatsuda et al. ................ 438/710 |
| 2010/0273332 A1* | 10/2010 | Edelberg ....................... 438/710 |

* cited by examiner

METHODS AND APPARATUSES FOR ENERGETIC NEUTRAL FLUX GENERATION FOR PROCESSING A SUBSTRATE

TECHNICAL FIELD

Embodiments of the present disclosure relate generally to methods and apparatuses for treating a substrate, and more particularly, to performing neutral beam activated chemical processing of the substrate.

BACKGROUND

Higher performance, lower cost, and greater density of integrated circuits are ongoing goals of the computer industry. In processing these integrated circuits on semiconductor substrates, layers are often deposited on the substrate and subsequently some or all of the layers are removed. One process for material removal from a substrate is plasma etching.

In plasma etching, plasma is utilized to assist etch processes by facilitating an anisotropic removal of material along fine lines, within vias, within contacts, and for other general patterning operations on a semiconductor substrate. Examples of such plasma assisted etching include reactive ion etching (RIE), which is essentially an ion activated chemical etching process.

In a plasma etching process reactive species are generated as a plasma from a bulk gas. The reactive species diffuse to a surface of a material being etched and are adsorbed on the surface of the material being etched. A chemical reaction occurs, which results in the formation of a volatile by-product, which is desorbed from the surface of the material being etched and diffuses into the bulk gas, where it can be purged from the reaction chamber.

Many plasma reactors provide energy to a gas in the reactor chamber by coupling Radio Frequency (RF) electric power into the chamber. The RF power ionizes, dissociates, and excites molecules within the plasma body. In particular, the RF power provides energy to free electrons in the plasma body. Ionization may occur from an energized free electron colliding with a gas molecule causing the gas molecule to ionize. Dissociation may occur from an energized free electron colliding with a gas molecule, such as $O_2$, causing the molecule to break into smaller molecular or atomic fragments, such as atomic oxygen. Excitation occurs when the collision, rather than breaking molecular bonds, transfers energy to the molecule causing it to enter an excited state. Control of the relative amounts of ionization, dissociation, and excitation depends upon a variety of factors, including the pressure and power density of the plasma. Due to ionization, the plasma body typically includes substantially equal densities of negatively and positively charged particles.

Plasmas may be particularly useful for anisotropic etching of a semiconductor substrate. Anisotropic etching is etching that occurs primarily in one direction, whereas isotropic etching is etching that occurs in multiple directions. Anisotropic etching is desirable for manufacturing integrated circuit devices, because it can be used to produce features with precisely located sidewalls that extend perpendicularly from the edges of a masking layer. This precision is important in devices that have feature sizes and spacing comparable to the depth of the etch.

To accomplish an anisotropic plasma etch, a semiconductor substrate such as a wafer may be placed in a plasma reactor such that a plasma forms in an electric field perpendicular to the substrate surface. This electric field accelerates ions perpendicularly toward the substrate surface for etching. One conventional approach to anisotropic plasma etching uses parallel planar electrodes. Often, the lower electrode acts as a pedestal for a wafer. RF power is applied to the electrodes to produce a plasma and accelerate ions toward the substrate surface.

The crystalline silicon or thin insulating layers of some modern integrated circuit designs may be damaged by high energy ion bombardment, so it may be necessary to decrease the RF power applied to the electrodes for lower ion energy etch processes. Decreasing the RF power, however, will reduce the ion density in the plasma. Decreased ion density usually decreases the etch rate.

Inductively coupled plasma reactors have been used with an RF coupling mechanisms to generate the plasma and control the ion density and ion bombardment energy. Power is applied to an induction coil surrounding the reactor chamber to inductively couple power into the chamber to produce the plasma. The inductively coupled power accelerates electrons circumferentially within the plasma. As a result, the charged particles generally do not accelerate in any specific direction. To move ions toward a substrate some type of bias is typically applied between the substrate and the plasma. In other words, a separate source of power may be needed and applied to a substrate support to accelerate ions toward the substrate for etching. A relatively high level of power may be applied to the induction coil to provide a plasma with a high ion density, and a relatively low level of power may be applied to the substrate support to control the energy of ions bombarding the substrate surface. As a result, a relatively high rate of etching may be achieved with relatively low energy ion bombardment.

While low energy ion bombardment may reduce damage to sensitive layers of the integrated circuit, other problems may be encountered that interfere with the anisotropic nature of the etch. In particular, low energy ions may be deflected by charges that accumulate on the substrate or mask surface during etching causing a charge buildup.

This charge buildup may result from the relatively isotropic motion of electrons in the plasma as opposed to the anisotropic motion of the ions. The normal thermal energy of the plasma causes the electrons to have high velocities because of their low mass. These high velocity electrons collide with molecules and ions and may be deflected in a variety of directions, including toward the substrate surface. While the negative bias on the substrate tends to repel electrons, the high velocity of some electrons overcomes this negative bias. The electrons are deflected in a variety of directions and have a relatively isotropic motion. As a result, electrons deflected toward the substrate surface tend to accumulate on elevated surfaces of the substrate or mask layer, rather than penetrating to the depths of narrow substrate features.

Ions, on the other hand, have a large mass relative to electrons, do not have high random velocities, and are directed toward the substrate in a perpendicular direction. This anisotropic acceleration allows ions to penetrate to the depths of narrow substrate features more readily than electrons.

As a result, negatively charged electrons tend to accumulate on the upper surfaces of the substrate or mask layer, while positively charged ions tend to accumulate in the recessed regions of the substrate that are being etched. These accumulated charges may form small electric fields, often referred to as "micro fields," near features on the surface of the substrate. While these small electric fields may have little effect on high energy ions, they may deflect low energy ions used in low energy etch processes for small integrated circuit features. The negative charge on the substrate or mask surface tends to attract positively charged ions, while the positive charge in recessed regions tends to repel these ions. As a result, low energy ions falling into recessed regions between features may be deflected into feature sidewalls, thereby undercutting the mask layer. This undercutting can degrade the anisotropic etch process and inhibit the formation of well-defined features with vertical sidewalls.

Because of these issues, and others, neutral beam etching processes have been proposed. In a neutral beam process, the ions are accelerated toward the substrate, but they then pass through a variety of proposed mechanisms to neutralize the ions by supplying electrons to the ions. The neutralized ions then strike the surface of the substrate with an amount of kinetic energy related to the mass and velocity of the neutralized ions. That kinetic energy is enough to cause a chemical reaction on the surface of the substrate. In other words, the chemical process, such as an etching process, at the substrate is activated by the kinetic energy of the incident neutral species.

These previously proposed neutralizing structures take different forms. As an example, one proposal includes a deflection plate that deflects the ions as they move toward the substrate by a small angle in one direction then another deflection plate deflects the ions back to a perpendicular direction relative to the substrate. These deflection plates are negatively charged such that the ions can readily pick up electrons and neutralize as they strike the plates and before they strike the substrate.

In another example of a previous proposal, one or more grids are disposed between a region where the plasma exists and the substrate. These grids may be configured to emit electrons such that as the ions travel through the grids and toward the substrate these emitted electrons are available for recombination with the ions to create neutral species for impact with the substrate.

However, these previously proposed neutral beam etching apparatuses require additional elements to be added to the reaction chamber to neutralize the ions. These additional elements add complexity and cost to the chamber as well as new elements that must be maintained. Moreover, as semiconductor wafers become very large, such as 300 millimeter wafers and above, these additional elements generally must span an area even larger than the wafer which may introduce structural problems with how to build the neutralizing structures without any physical deformation across the large area.

The inventor has appreciated that for the reasons stated above, and for other reasons, there is a need in the art for alternative and simplified structures and processes for generating neutral beam flux for processing substrates.

BRIEF DESCRIPTION OF THE DRAWINGS

In the drawings, which illustrate embodiments of the invention.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that process, chemical, structural, logical, and electrical changes may be made within the scope of the present invention.

The terms "wafer" and "substrate" are to be understood as a semiconductor-based material including silicon, silicon-on-insulator (SOI) or silicon-on-sapphire (SOS) technology, thin film transistor (TFT) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. The semiconductor need not be silicon-based, but may be based on silicon-germanium, silicon-on-insulator, silicon-on-sapphire, germanium, or gallium arsenide, among others. In addition, directional references, e.g., upper, lower, top, bottom and sides, are relative to one another and need not refer to an absolute direction.

Moreover, some embodiments may be configured for use in the formation of masks for semiconductor devices. As a result, a substrate may also include transparent substrates (e.g., quartz and glass) suitable for bearing photolithography masks thereon.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

For ease of following the description, for the most part element number identifiers begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Embodiments discussed herein provide simplified structures and processes for generating neutral beam flux for processing substrates by using Direct Current (DC) pulses to generate plasmas and convert ions within the plasma to energetic neutral species directed toward a substrate.

Figure 1A:
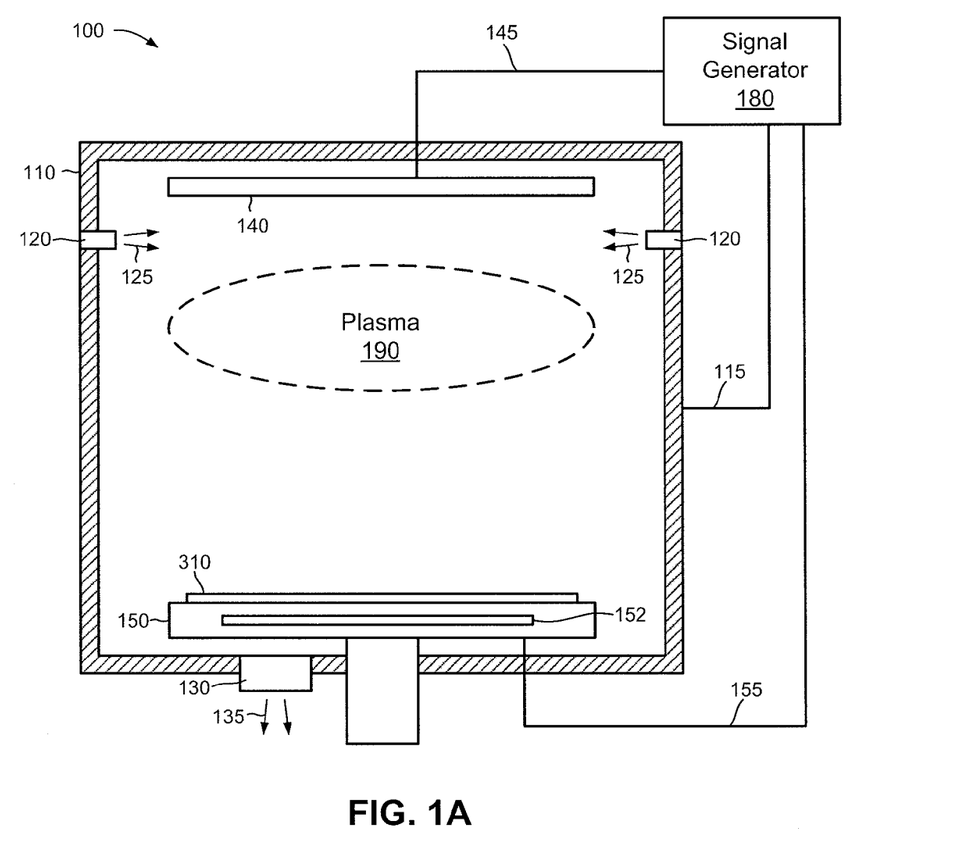
FIG. 1A is a simplified diagram of a processing chamber for generating plasma and energetic neutrals from the plasma.

FIG. 1A is a simplified diagram of a processing apparatus 100 for generating plasma and energetic neutrals from the plasma. A processing chamber 110 includes an electrode 140 disposed therein. This electrode 140 may be substantially circular and disposed opposite a substrate holder 150. A substrate 310 is shown disposed on the substrate holder 150. One or more inlet ports 120 may be configured to introduce a gas 125 into the processing chamber 110 and pressurize or depressurize the processing chamber 110 to a suitable pressure as discussed below. One or more exhaust ports 130 may be configured to purge the processing chamber 110 of effluent gasses 135 after some processing steps.

The substrate holder 150 may include a temperature adjuster 152 controlled by a signal generator 180 or other type of controller (not shown). Details of temperature adjustment are discussed more fully below. The signal generator 180 may also be configured to apply a substrate signal 155 to the substrate holder 150 and the substrate 310 thereon to bias the substrate holder 150 and substrate 310 to a desired voltage as discussed below.

The signal generator 180 may also apply a chamber bias signal 115 coupled to the processing chamber 110 and for setting portions or all of the interior walls to a chamber bias voltage. In many embodiments, the chamber bias signal 115 would be set to a ground voltage. The chamber bias signal 115 may also be referred to herein as a first DC signal 115.

The signal generator 180 may also apply an electrode signal 145 to the electrode 140. The electrode signal 145 may also be referred to herein as a pulsed DC signal 145 and a second DC signal 145. The pulsed DC signal 145, when driven with a sufficiently high voltage, will cause a plasma 190 to form from the gas 125 disposed in the processing chamber 110.

Figure 1B:
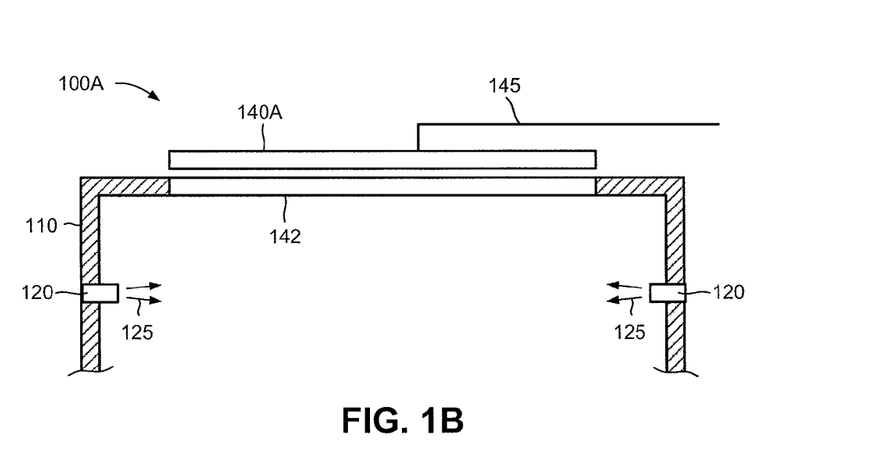
FIG. 1B depicts another embodiment of an upper portion of the processing chamber of FIG. 1A.

FIG. 1B depicts another embodiment of an upper portion of the processing chamber 110 of FIG. 1A. In the FIG. 1B embodiment, the electrode 140A driven by the pulsed DC signal 145 is disposed outside the processing chamber 110 and near a dielectric window 142 formed in an upper wall of the processing chamber 110. In this configuration, the electrode 140A may capacitively couple through the dielectric window 142 with the interior of the processing chamber 110 to develop voltage potential in the interior of the processing chamber 110 sufficient for generating the plasma 190.

Figure 2A:
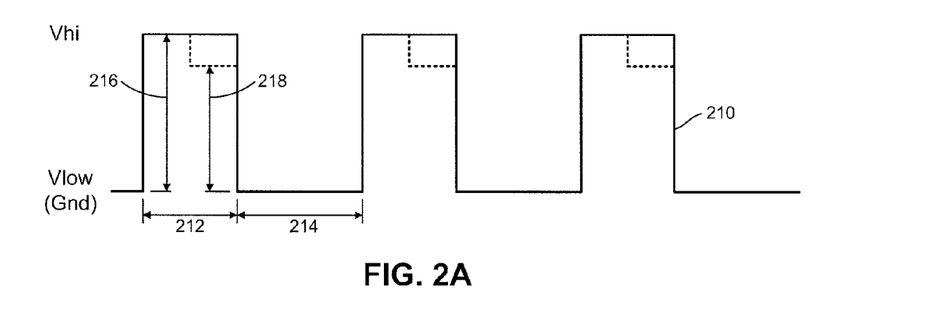
FIGS. 2A-2C are timing diagrams illustrating waveforms representing pulsed direct current (DC) signals that may be used in various embodiments discussed herein.
Figure 2B:
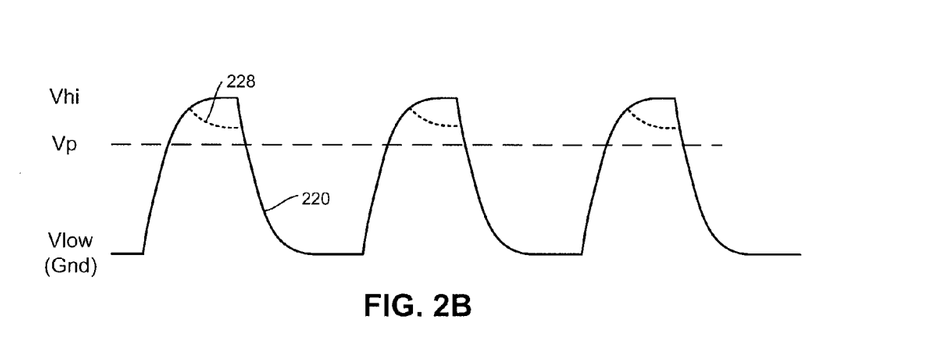
Figure 2C:
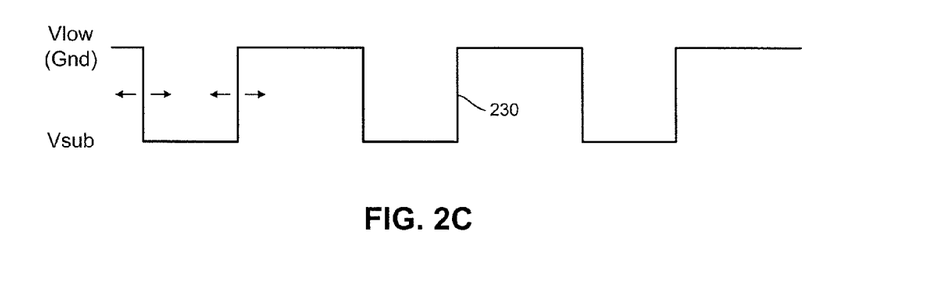

FIGS. 2A-2C are timing diagrams illustrating waveforms (210, 220, and 230) representing pulsed direct current (DC) signals that may be used in various embodiments discussed herein. Referring to FIG. 1A as well as FIGS. 2A-2C, waveform 210 illustrates a series of DC pulses that may be applied to the electrode signal 145. Waveform 220 illustrates a voltage potential that will develop within the processing chamber 110 as a result of the pulsed DC signal 145 applied to the electrode 140. Waveform 230 illustrates a possible bias that may be applied in some embodiments to the substrate 310 through the substrate signal 155. Arrows near the rising edge and falling edge of Waveform 230 illustrate that the pulse initiation and duration may be adjusted relative to waveform 210 as is explained more fully below. In general, the bias shown by waveform 230 indicates that the substrate signal 155 would have a negative DC pulse (i.e., from Vlow to Vsub) relative to the positive DC pulse on the electrode signal 145 shown by waveform 210.

The parameter Vlow illustrates a beginning voltage for the pulsed DC signals (waveforms 210, 220, and 230). In many embodiments, this Vlow parameter would be set to a DC ground. The Vhi parameter indicates a high voltage applied to the electrode 140. At a plasma voltage, designated Vp, the voltage will be high enough to generate a plasma 190 from the gas 125 in the chamber and cause some of the molecules in the gas 125 to ionize creating free electrons and ions from the gas 125. After a first time period 212 (also referred to herein as an on-time 212), the voltage is returned to Vlow for a second time period 214 (also referred to herein as an off-time 214). These pulses may be repeated a number of times to create periodic DC pulses as explained more fully below. The amplitude between Vhi and Vlow may be referred to herein as a first voltage difference 216.

In some embodiments, once the plasma 190 has formed, the voltage on waveform 210 may be adjusted up or down (illustrated as down to a second voltage difference 218 on FIGS. 2A and 228 on FIG. 2B). This adjustment may be done to promote or reduce the voltage potential that accelerates ions toward the substrate 310 as explained more fully below.

Pulse durations, amplitude of the voltage (i.e., the difference between Vhi and Vlow), and number of pulses may vary greatly depending on the type of processing to be performed. As non-limiting examples, the Vhi voltage may be in the 100s of volts and possibly up to kilovolts. As non-limiting examples, pulse duration may be in the second to millisecond range and possible down to microseconds.

Figure 3A:
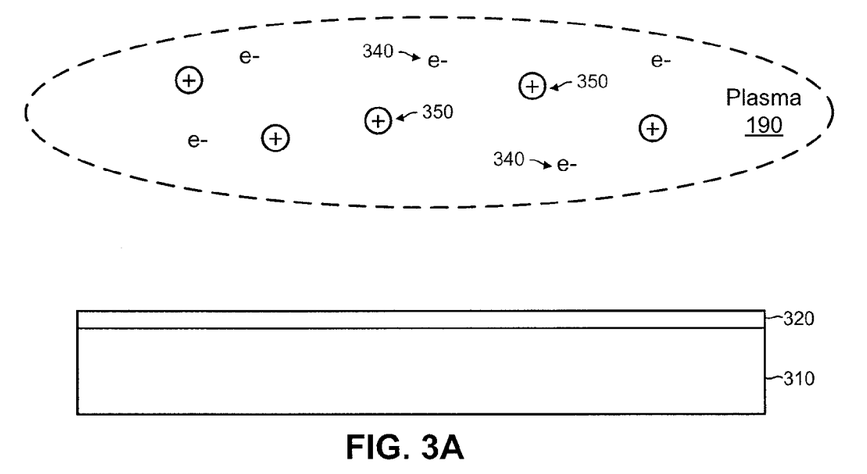
FIGS. 3A-3C show generation of energetic neutrals from a plasma at various points in time during substrate processing.
Figure 3B:
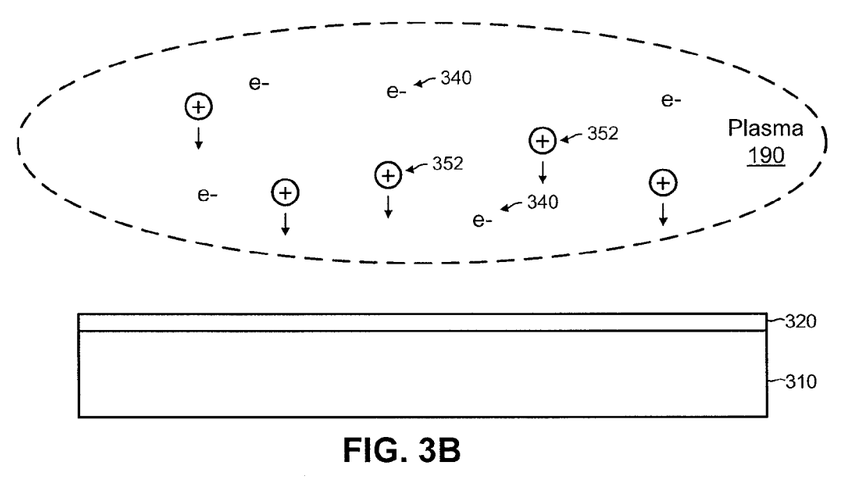
Figure 3C:
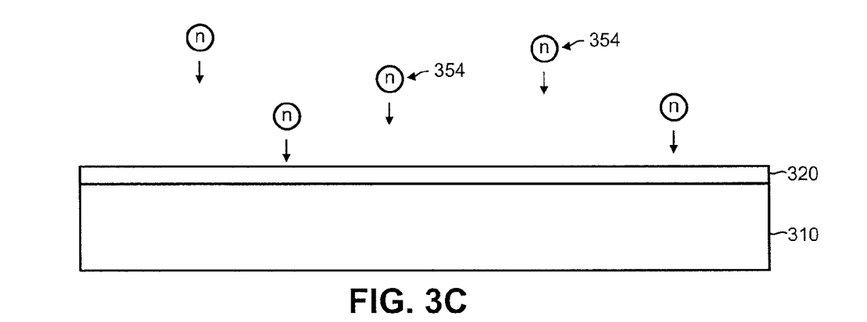

FIGS. 3A-3C show generation of energetic neutrals 354 from a plasma 190 at various points in time during substrate processing.

Figure 4:
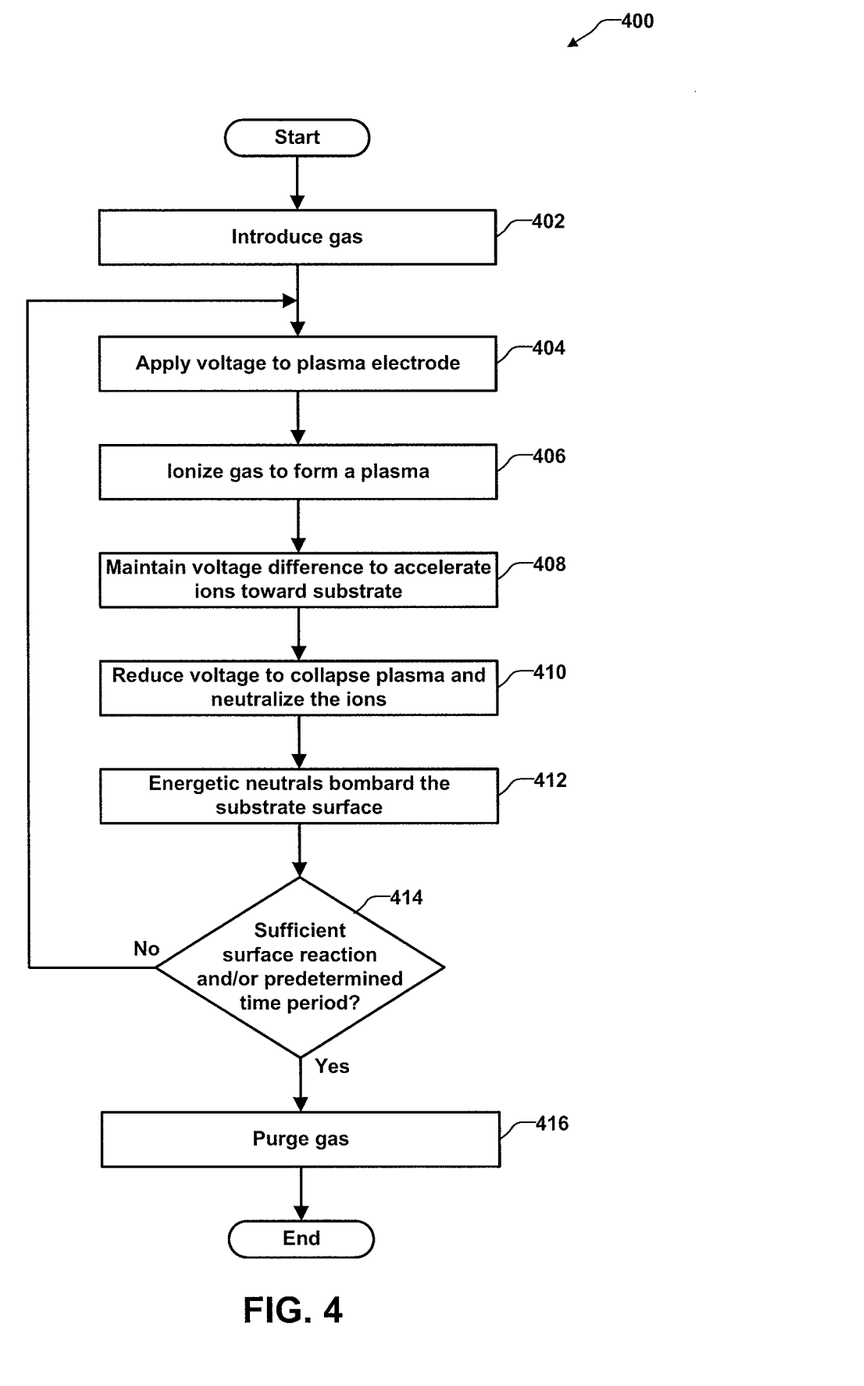
FIG. 4 is a flow diagram illustrating some of the acts performed during generation of energetic neutrals from a plasma.

FIG. 4 is a flow diagram illustrating some of the acts performed during generation of energetic neutrals 354 from a plasma 190. FIGS. 4 and 3A-3C are discussed together to illustrate an energetic neutral generation process 400. In addition, reference will be made to FIGS. 1A and 2A-2C, when discussing the processing apparatus 100 and waveforms.

At operation 402, a gas is introduced into the processing chamber 110. The gas may be many different species of inert gasses as well as many different species of reactive gasses. More details of the types of gasses are discussed below with reference to FIGS. 5A-5C and FIGS. 6A-6D.

At operation 404, a voltage is applied to the electrode 140. At operation 406, the voltage on the electrode, and voltage potential within the processing chamber 110, is high enough to ionize the gas into electrons 340 and ions 350 and form the plasma 190 above the substrate 310, as shown in FIG. 3A. In some embodiments, a material 320 to be processed (e.g., etched) may be disposed on the substrate 310. In other embodiments, the substrate 310 itself may be the material to be processed.

At operation 408, the voltage potential on the electrode 140 is maintained to maintain the plasma and to accelerate the ions toward the substrate as energetic ions 352, as shown in FIG. 3B. The high voltage on the electrode 140 will repel the positively charged ions away from the electrode and toward the substrate. As mentioned earlier, the voltage on the electrode 140 may be adjusted up or down to a second voltage difference 218 for a portion of the pulse to respectively enhance or impede the acceleration of ions toward the substrate 310.

At operation 410, the voltage on the electrode is reduced to Vlow, which causes the plasma to collapse. The initial pulse potential causes an ionization event that triggers free electrons that have the ability to cause additional ionization events, which generates the plasma. Removal of the pulse potential collapses (i.e., self neutralizes) the plasma because there is no driving potential to cause electron acceleration to maintain the plasma.

Removal of the pulse potential also enables the energetic ions 352 to recombine with free electrons 340 in the chamber to create energetic neutrals 354, as shown in FIG. 3C. There is a natural tendency for the charged energetic ions 352 to interact with electrons 340 and neutralize the energetic ions 352, which are then referred to herein as energetic neutrals 354.

Therefore, during the time the electrode is off (or at the Vlow potential) the positive energetic ions 352 have a velocity directed away from the electrode 140, the energetic ions 352 will become neutralized but will retain their thermal velocity toward the substrate 310 to become energized neutral species.

The energetic ions 352 have a momentum towards the substrate 310, whereas the electrons 340 may be moving in any random direction. However, because the mass of the energetic ions 352 is so much higher that the electrons 340, the electrons 340 will move toward the energetic ions 352 and when they combine to form the energetic neutrals 354 the directional momentum of the energetic neutrals 354 is not modified significantly.

"Energized" or "energetic" as used herein means that the ions or neutrals have kinetic energy due to their momentum, rather than having any specific type of charge. Ions have a positive charge and neutrals have a neutral charge.

While not illustrated in FIG. 4, it should be understood that the off-time 214, as shown in FIG. 2A, may be adjusted to allow sufficient time for the neutralization of most, if not all, of the energetic ions 352.

At operation block 412, the energetic neutrals 354 bombard (also referred to herein as impact) the surface of the substrate 310 or the material 320 disposed on the substrate 310. When the energetic neutrals 354 hit the surface, they don't have an electrical charge, which may promote reactions with the material 320. However, the energetic neutrals 354 do have kinetic energy due to their momentum. This energy may be sufficient to promote or cause chemical reactions in the material 320. As a non-limiting example, this chemical reaction may cause an etching of the material 320.

At decision block 414, a determination is made if a sufficient chemical reaction has occurred with the material 320, substrate 310, are combination thereof. This determination may be made from measurements of the chemical reaction or may be determined as a predetermined time period or number of pulses that would cause the desired amount of chemical reaction. If sufficient reaction has not occurred, the process loops back to operation block 404 to begin a new DC pulse. If sufficient reaction has occurred, gas in the processing chamber 110 may be purged at operation block 416 to prepare for additional processing steps.

Thus, the process 400 may continue the flux of energetic neutrals 354 for a predetermined time period, such as, for example, a few seconds to get enough bombardment by energetic neutrals 354 to obtain the desired reactions.

Energetic species bombarding a substrate 310 with enough energy may cause physical sputtering, which may cause undesired damage to the substrate. Therefore, embodiments of the present invention may limit or eliminate physical sputtering while still allowing chemical sputtering (i.e., the chemical reactions). In other words, the chemical reaction will appear more like reactive ion etching even though neutrals are used, rather than ions, and physical sputtering can be reduced by limiting the energy of the energetic neutrals 354.

Embodiments of the present invention may be particularly useful for Atomic Layer Etching (ALE) because the energetic neutrals can be well controlled to remove a single atomic layer of the material 320 or the substrate 210.

The energy of the energetic neutrals 354 may be controlled as discussed above based on the amplitude of the first voltage difference 216 and the second voltage difference 218. In addition, some embodiment may apply a bias to the substrate holder 150 and substrate 310 to modify the momentum of the energetic neutrals 354. As shown in FIG. 2C and FIG. 1A, the substrate signal 155 (represented by waveform 230) may include a negative voltage potential (Vsub) relative to Vlow to attract the energetic neutrals 354 toward the substrate 310. Moreover, the edges of the DC pulse on the substrate signal 155 may be moved relative to the edges on the electrode signal 145 (represented by waveform 210). As a non-limiting example, the falling edge of the substrate signal 155 may be moved to the right relative to the rising edge of the electrode signal 145 such that the attraction to the substrate 310 does not begin until after the plasma 190 has formed. As another non-limiting example the rising edge of the substrate signal 155 may be moved to the right relative to the falling edge of the electrode signal 145 to continue acceleration of the energetic ions 352 toward the substrate 310 even after the acceleration due to the positive potential on the electrode signal 145 is gone.

As a result, there are many mechanisms for controlling the energy of the energetic neutrals 354 when they impact the substrate 310. These mechanisms include the amplitude of the first voltage difference 216, the amplitude of the second voltage difference 218, the on-time 212 of the electrode signal 145, the off-time 214 of the electrode signal 145 and in some embodiments, the amplitude and relative timing of the substrate signal 155.

Figure 5A:
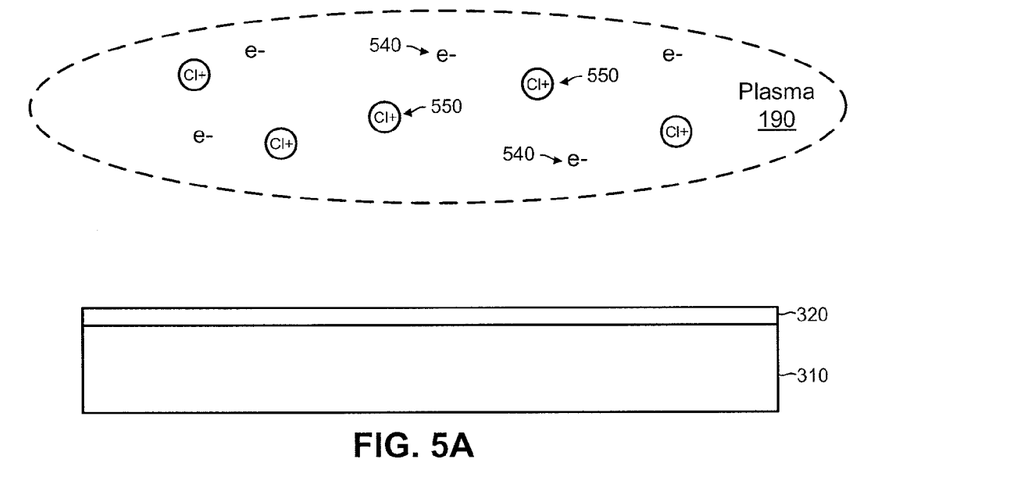
FIGS. 5A-5C show generation of energetic reactive neutrals from a plasma at various points in time during substrate processing.
Figure 5B:
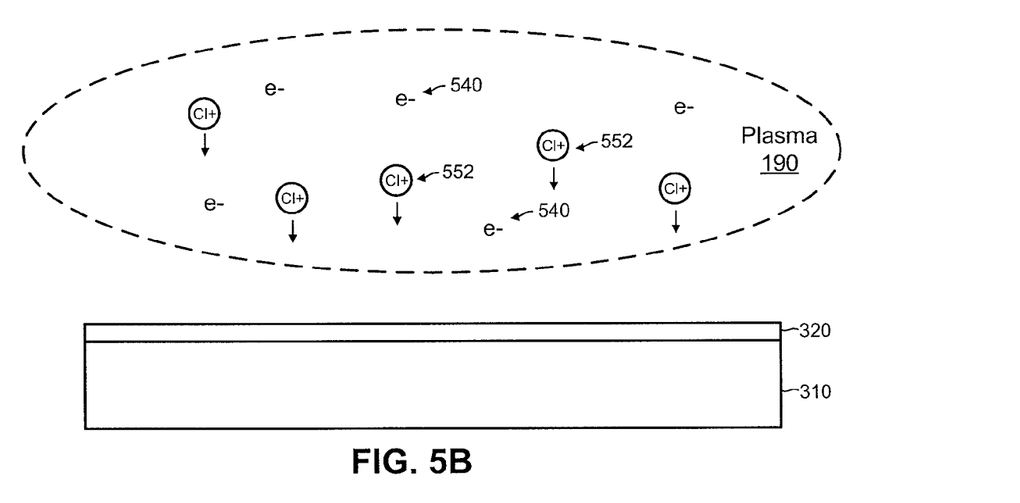
Figure 5C:
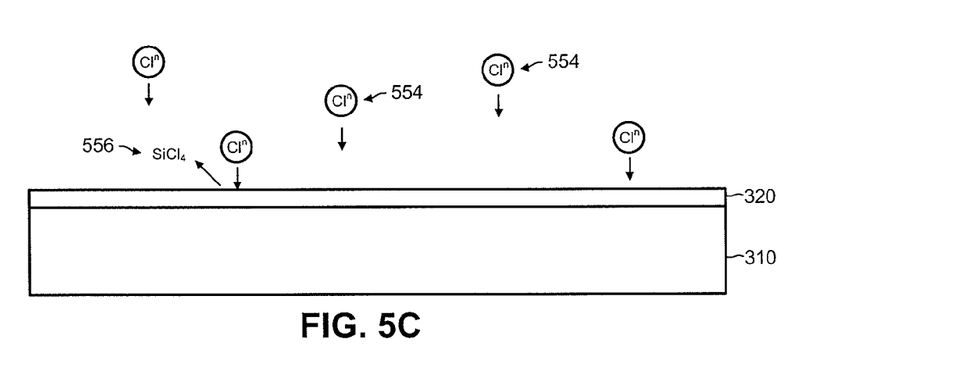

FIGS. 5A-5C show generation of energetic reactive neutrals 554 from a plasma 190 at various points in time during substrate processing. Chlorine is used as an example of a reactive gas in the processing shown in FIGS. 5A-5C. However, many other gasses, such as, for example, fluorine and other reactive species may be used depending on the type of chemical reaction desired with the substrate 310, material 320 on the substrate 310, or combination thereof. Chlorine gas is introduced into the processing chamber 110 and ionized to create chlorine ions 550 and electrons 540 in a plasma 190, as shown in FIG. 5A. The chlorine ions are accelerated toward the substrate 310 to create energetic chlorine ions 552, as shown in FIG. 5B. This process is similar to that discussed above with respect to generic energetic ions 352 and need not be repeated.

The energetic chlorine ions 552 are neutralized to energetic chlorine neutrals 554, as shown in FIG. 5C. Again, this process is similar to that discussed above with respect to generic energetic neutrals 354 and need not be repeated. In the example of FIGS. 5A-5C, the energetic chlorine neutrals 554 impact the substrate 310 and silicon thereon to cause a chemical reaction, generate silicon tetrachloride 556, and etch a portion of the silicon. The silicon tetrachloride 556 can be purged from the processing chamber 110 after the desired reactions have completed. This process is similar to a reactive ion etch process except that reactive neutrals are used, rather than ions, and the kinetic energy of the reactive neutrals supplies enough energy for the reaction between the silicon and the energetic chlorine neutrals 554 to occur.

Figure 6A:
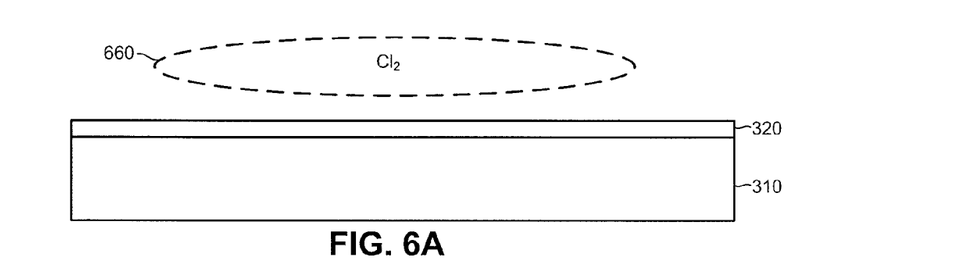
FIGS. 6A-6D show generation of energetic inert neutrals from a plasma at various points in time during substrate processing.
Figure 6B:
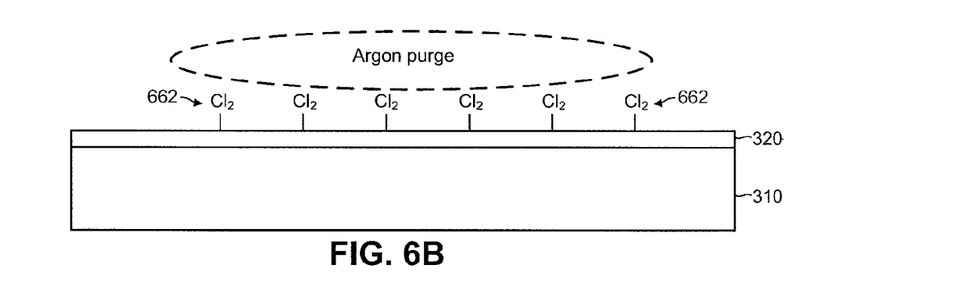

FIGS. 6A-6D show generation of energetic inert neutrals 654 from a plasma 190 at various points in time during substrate processing. In FIGS. 6A and 6B, chlorine gas 660 is introduced to the processing chamber 110 and chemisorbed as chlorine 662 on the substrate 310 through any suitable process, such as, for example, atomic layer deposition or bulk deposition. Excess chlorine gas 660 may be purged from the processing chamber 110, by any suitable means, such as, for example, an argon purge.

Figure 6C:
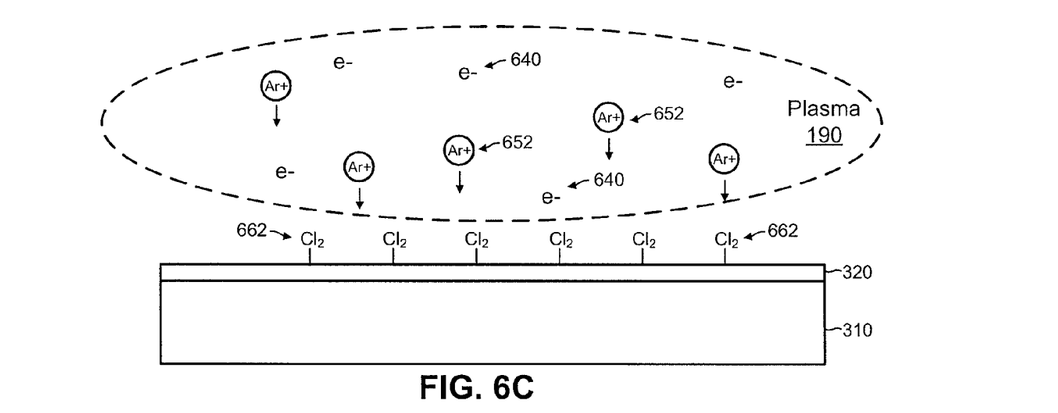
Figure 6D:
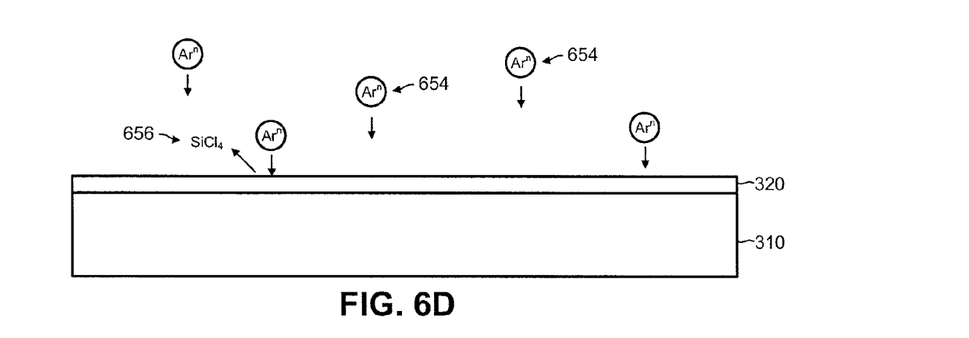

FIGS. 6C and 6D illustrate the pulsed DC plasma process as discussed above with reference to FIGS. 3A-3C, but with energetic inert neutrals 654 rather than generic energetic neutrals 354. For brevity, the process acts associate with FIG. 3A are not shown and the process acts of FIGS. 6C and 6D are similar to those of FIGS. 3B and 3C, respectively. Argon is used as an example of an inert gas in the processing shown in FIGS. 6C and 6D. However, many other gasses, such as, for example, nitrogen, neon and other inert species may be used to cause a chemical reaction on the substrate 310, material 320 on the substrate 310, or combination thereof.

Argon gas is introduced into the processing chamber 110 and ionized to create argon ions (not shown) and electrons 640 in a plasma 190. The argon ions are accelerated toward the substrate 310 to create energetic argon ions 652, as shown in FIG. 6C. This process is similar to that discussed above with respect to generic energetic ions 352 and need not be repeated.

The energetic argon ions 652 are neutralized to energetic argon neutrals 654, as shown in FIG. 6D. Again, this process is similar to that discussed above with respect to generic energetic neutrals 354 and need not be repeated. In the example of FIGS. 6A-6D, the energetic argon neutrals 654 impact the substrate 310 of silicon and the chlorine 662 disposed thereon. The energy of the impact is sufficient to cause the chlorine to break up and become reactive upon impact by the energetic argon neutrals 654 causing a chemical reaction between the silicon and chlorine to generate silicon tetrachloride 556 and etch a portion of the silicon. The silicon tetrachloride 556 can be purged from the processing chamber 110 after the desired reactions have completed. With this process, an atomic layer etch of the silicon may be accomplished.

The example discussed above with respect to FIGS. 6A-6D illustrates chlorine 662 being chemisorbed onto the substrate 310. However, a species also may be physisorbed on the substrate 310. Thus, in FIGS. 6A and 6B, with the proper chamber parameters and substrate temperature, the chlorine 662, or other suitable material (e.g., $BCL_3$ and HBr), may be physisorbed onto silicon by any suitable process such as, for example, atomic layer deposition or bulk deposition.

Then, in the example of FIGS. 6A-6D, the energetic argon neutrals 654 impact the substrate 310 of silicon and the chlorine 662 disposed thereon. The energy of the impact is sufficient to cause a chemical reaction between the silicon and physisorbed chlorine to generate silicon tetrachloride 656 and etch a portion of the silicon. The silicon tetrachloride 656 can be purged from the processing chamber 110 after the desired reactions have completed. With this process, an atomic layer etch of the silicon may be accomplished. Of course, other substrate materials may be used and other physisorbed species may be used to cause a chemical reaction therebetween when energy is supplied by the impact of the energetic neutrals 654.

Examples have been discussed using specific substrates, materials, and chemical reactions to describe embodiments of the present invention. However, many other substrates, materials, and energetic neutral species may be used. As non-limiting examples, silicon, silicon dioxide, hafnium oxide, silicon nitride, and metals such as copper, may be used as the substrate 310 or material 320 thereon.

Pressure in the processing chamber 110 may be set at a broad range of pressures depending on the type of gas to be ionized, the voltage on the pulsed DC signal 145, and other factors. The pressure may be readily determined by a person skilled in the art of plasma generation with DC signals. As non-limiting examples, the pressure may be in the range of millitorrs to torrs. As a low-end non-limiting example, the pressure may be near about 10 millitorrs. In some, embodiments, the pressure may be as high as near atmospheric pressure.

Returning to FIG. 1A, it may be useful to modify the temperature of the substrate 310 to promote or suppress the chemical reactions. As a result, the processing apparatus 100 may include the temperature adjuster 152. The temperature adjuster 152, under control of the signal generator 180 or other controller (not shown), may be configured to adjust and control the temperature of the substrate 310. The temperature adjuster 152 may include temperature control elements, such as a cooling system including a re-circulating coolant flow that receives heat from the substrate holder 150 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 150.

The signal generator 180 may be a dedicated device configured for generating the various signals defined above. The signal generator 180 may also be a special purpose controller, a general purpose controller, a special purpose processor, or a general purpose microprocessor with accompanying devices such as voltage control devices, analog-to-digital converters, digital-to-analog converters, and memories. The memories may include volatile storage such as Dynamic Random Access Memory (DRAM) and Static Random Access Memory (SRAM) as well as non-volatile memory and storage such as Erasable Programmable Read-Only Memory (EPROM), Flash memory, magnetic storage devices, and optical storage devices.

CONCLUSION

Embodiments discussed herein provide simplified structures and processes for generating neutral beam flux for processing substrates.

In some embodiments, a method of treating a substrate includes forming a plasma in a processing chamber. Ions of the plasma are accelerated to become energetic ions moving toward a substrate disposed in the processing chamber. At least some of the energetic ions are neutralized to generate energetic neutrals moving toward the substrate by collapsing the plasma and at least some of the energetic neutrals impact the substrate.

In other embodiments, a method of treating a substrate includes applying a first DC signal to an interior portion of a processing chamber. A second DC signal is applied to an electrode associated with the processing chamber with a first voltage difference between the second DC signal and the first DC signal sufficient to establish a plasma within the processing chamber. A second voltage difference is maintained between the second DC signal and the first DC signal for a first time period sufficient to accelerate ions of the plasma toward the substrate as energetic ions. Subsequently, the voltage difference between the first DC signal and the second DC signal is reduced for a second time period and to a magnitude sufficient to neutralize at least some of the energetic ions to energetic neutrals moving toward the substrate. In some embodiments, the first voltage difference and the second voltage difference may be equal.

In other embodiments, a method of treating a substrate includes forming a reactive film on a surface of a substrate disposed in a processing chamber from a reactive gas introduced into the processing chamber. A plasma is formed from an inert gas introduced in the processing chamber. Ions of the plasma are accelerated to become energetic inert ions moving toward the substrate. At least some of the energetic inert ions are neutralized by collapsing the plasma to generate energetic inert neutrals moving toward the substrate and the at least some of the energetic inert neutrals impact the substrate.

In yet other embodiments, a processing apparatus includes a processing chamber for generating a plasma therein, an electrode associated with the processing chamber, and a signal generator operably coupled to the electrode. The signal generator is configured for applying a DC pulse to the electrode. The DC pulse has sufficient amplitude and sufficient duty cycle of an on-time and an off-time to cause events within the processing chamber. A plasma is generated from a gas disposed in the processing chamber responsive to the amplitude of the DC pulse. Energetic ions are generated by accelerating ions of the plasma toward a substrate disposed in the processing chamber in response to the amplitude of the DC pulse during the on-time, and at least some of the energetic ions are neutralized to energetic neutrals in response to the DC pulse during the off-time.

In still other embodiments, a method of treating a substrate includes forming a physisorbed inert species on a surface of a substrate disposed in a processing chamber. A plasma is formed from an inert gas introduced in the processing chamber. Ions of the plasma are accelerated to become energetic inert ions moving toward the substrate. At least some of the energetic inert ions are neutralized by collapsing the plasma to generate energetic inert neutrals moving toward the substrate and the at least some of the energetic inert neutrals impact the substrate.

Although the present invention has been described with reference to particular embodiments, the present invention is not limited to these described embodiments. Rather, the present invention is limited only by the appended claims and their legal equivalents.

What is claimed is:

1. A method of treating a substrate, comprising:
    forming a plasma in a processing chamber by applying a DC voltage to an electrode associated with the processing chamber but electrically decoupled from the substrate, the DC voltage of sufficient amplitude to cause the plasma to form;
    accelerating ions of the plasma to become energetic ions moving toward the substrate disposed in the processing chamber by maintaining the DC voltage on the electrode for a first duration;
    neutralizing at least some of the energetic ions to generate energetic neutrals moving toward the substrate by removing the DC voltage from the electrode for a second duration sufficient to:
        enable the at least some of the energetic ions to be neutralized by combining with electrons before reaching the substrate; and
        retain a kinetic energy of the energetic neutrals toward the substrate; and
    impacting the substrate with at least some of the energetic neutrals.

2. The method of claim 1, wherein the plasma is formed from a reactive gas to generate energetic reactive neutrals.

3. The method of claim 1, wherein the plasma is formed from an inert gas to generate energetic inert neutrals.

4. The method of claim 1, further comprising:
    applying a ground voltage to the processing chamber; and
    applying a second pulsed DC signal to the substrate wherein a pulse amplitude of the second pulsed DC signal is negative relative to the ground voltage.

5. The method of claim 1, wherein the impacting the substrate causes a reaction with a material on a surface of the substrate to perform an atomic layer etch of the material.

6. The method of claim 5, wherein the forming, accelerating, neutralizing, and impacting are sequentially repeated until the reaction is sufficient to remove a predetermined amount of the material, a predetermined time period has elapsed, or a combination thereof.

7. A method of treating a substrate, comprising:
    forming a reactive film on a surface of a substrate disposed in a processing chamber from a reactive gas introduced into the processing chamber;
    forming a plasma from an inert gas introduced in the processing chamber with a DC voltage applied to an electrode associated with the processing chamber but electrically decoupled from the substrate, the DC voltage of sufficient amplitude to cause the plasma to form;
    accelerating ions of the plasma to become energetic inert ions moving toward the substrate by maintaining the DC voltage on the electrode for a first duration;
    neutralizing at least some of the energetic inert ions by removing the DC voltage from the electrode for a second duration sufficient to enable the at least some of the energetic inert ions to be neutralized by combining with electrons before reaching the substrate to generate energetic inert neutrals moving toward the substrate; and
    impacting the substrate with at least some of the energetic inert neutrals;
    wherein a combination of the first duration and the second duration is sufficient to retain a kinetic energy of the energetic inert neutrals toward the substrate.

8. The method of claim 7, wherein the impacting the substrate causes a reaction of the reactive film with a material on the surface of the substrate to remove a portion of the material.

9. The method of claim 7, further comprising repeating the forming, accelerating, neutralizing and impacting to achieve a desired etching amount of a material on the surface of the substrate.

10. The method of claim 7, further comprising:
    applying a ground voltage to the processing chamber; and
    applying a second pulsed DC signal to the substrate wherein a pulse amplitude of the second pulsed DC signal is negative relative to the ground voltage.

11. A method of treating a substrate, comprising:
    forming a physisorbed inert species on a surface of a substrate disposed in a processing chamber;
    forming a plasma from an inert gas introduced in the processing chamber with a DC voltage applied to an electrode associated with the processing chamber but electrically decoupled from the substrate the DC voltage of sufficient amplitude to cause the plasma to form;
    accelerating ions of the plasma to become energetic inert ions moving toward the substrate by maintaining the DC voltage on the electrode for a first duration;
    neutralizing at least some of the energetic inert ions by removing the DC voltage from the electrode for a second duration sufficient to enable the at least some of the energetic inert ions to be neutralized by combining with electrons before reaching the substrate to generate energetic inert neutrals moving toward the substrate; and
    impacting the substrate with at least some of the energetic inert neutrals;
    wherein a combination of the first duration and the second duration is sufficient to retain a kinetic energy of the energetic inert neutrals toward the substrate.

12. The method of claim 11, wherein the impacting the substrate causes a reaction with the physisorbed inert species to cause the physisorbed inert species to become reactive and react with a material underlying the physisorbed inert species and to cause an atomic layer etch of the material.

\* \* \* \* \*

UNITED STATES PATENT AND TRADEMARK OFFICE
CERTIFICATE OF CORRECTION

| | | |
|---|---|---|
| PATENT NO. | : 8,828,883 B2 | Page 1 of 1 |
| APPLICATION NO. | : 12/862359 | |
| DATED | : September 9, 2014 | |
| INVENTOR(S) | : Rueger | |

It is certified that error appears in the above-identified patent and that said Letters Patent is hereby corrected as shown below:

In the Claims

Column 12, line 52, Claim 11, delete "substrate" and insert -- substrate, --, therefor.

Signed and Sealed this
Eleventh Day of November, 2014

Michelle K. Lee
*Deputy Director of the United States Patent and Trademark Office*